(12) United States Patent  
Heigl

(10) Patent No.: US 7,383,746 B2  
(45) Date of Patent: Jun. 10, 2008

(54) COMPLIANCE MODULE, PARTICULARLY FOR A MANIPULATOR FOR POSITIONING A TEST HEAD, AND ONE SUCH MANIPULATOR

(76) Inventor: Helmuth Heigl, Anemonenstrasse 3a, Kolbermoor (DE) 83059

( * ) Notice: Subject to any disclaimer, the term of this patent is extended or adjusted under 35 U.S.C. 154(b) by 123 days.

(21) Appl. No.: 11/060,583

(22) Filed: Feb. 18, 2005

(65) Prior Publication Data

US 2005/0194985 A1   Sep. 8, 2005

(30) Foreign Application Priority Data

Feb. 20, 2004 (DE) .................... 10 2004 008 487

(51) Int. Cl.  
*G01D 21/00* (2006.01)  
(52) U.S. Cl. .................... 73/866.5; 324/158.1  
(58) Field of Classification Search ............... 73/866.5; 324/158.1, 765  
See application file for complete search history.

(56) References Cited

U.S. PATENT DOCUMENTS

| 5,450,766 | A  | * | 9/1995 | Holt ......................... 73/866.5 |
| 6,717,432 | B2 | * | 4/2004 | Chiu et al. ................. 324/765 |
| 6,722,215 | B2 | * | 4/2004 | Caradonna et al. ........ 73/866.5 |
| 6,766,996 | B1 | * | 7/2004 | Somers ....................... 248/650 |
| 6,838,868 | B1 | * | 1/2005 | Bosy ........................ 324/158.1 |
| 2005/0127897 | A1 | * | 6/2005 | Bosy et al. .............. 324/158.1 |

FOREIGN PATENT DOCUMENTS

DE          10132489       4/2003  
WO          03089834       10/2003

* cited by examiner

Primary Examiner—Hezron Williams  
Assistant Examiner—Nashmiya Fayyaz  
(74) Attorney, Agent, or Firm—Novak Druce & Quigg, LLP

(57) ABSTRACT

A compliance module, particularly for a manipulator for positioning a test head, comprising a housing that is securable to a component. The compliance module furthermore comprises an inner sleeve shiftingly mounted in said housing and axially urged by a spring element, and a pin arranged on said housing and connected to said inner sleeve. A compliance module of such kind provides a precise location on the one hand and a certain compliance achievable of a portion of the manipulator for positioning a test head on the other hand.

20 Claims, 4 Drawing Sheets

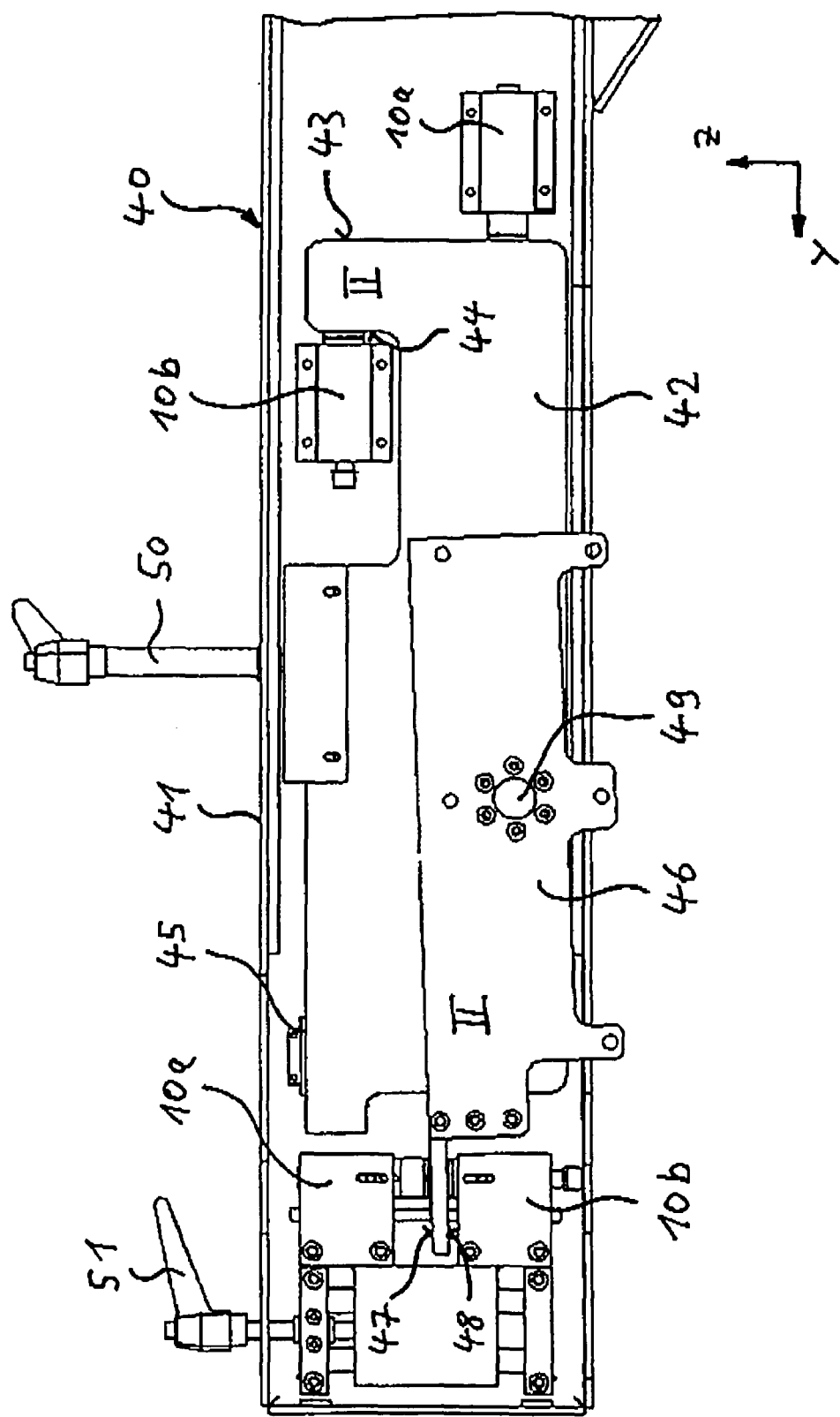

US 7,383,746 B2

COMPLIANCE MODULE, PARTICULARLY FOR A MANIPULATOR FOR POSITIONING A TEST HEAD, AND ONE SUCH MANIPULATOR

CROSS-REFERENCE TO RELATED APPLICATION

This claims priority under 35 USC 119 from German Patent Appln. No. 10 2004 008 487.4, filed Feb. 20, 2004, incorporated herein by reference in its entirety.

FIELD OF THE INVENTION

The invention relates to a compliance module, finding application particularly for a manipulator for positioning a test head. The invention relates further to a manipulator serving particularly for positioning a test head at a testing device and provided with means for positioning a test head three-dimensionally.

BACKGROUND ART

A manipulator for positioning a test head usually has several translational and rotational degrees of freedom in thus being suitable for precisely positioning the test head three-dimensionally. This is why such a manipulator finds application, as a rule, in testing electronic devices, such as for example ICs or wafers. To permit testing proper functioning of the electronic devices it is necessary that the relatively heavy test head is precisely docked at a testing device. The testing device, for example a component handler or wafer tester furnishes the electronic devices to be tested by the test head. Obtaining a genuine result in testing electronic devices requires precise docking of the test head at the testing device, it being for this reason that precisely and smoothly locating the manipulator positioning the test head is mandatory.

DE 101 32 489 A1 incorporated herein by reference in its entirety describes a manipulator excelling by exactly reproducible motion of the test head. This is primarily due to the manipulator being provided with means for three-dimensionally positioning the test head, comprising articulated arms pivotable in the horizontal plane. The articulated arms are coupled to slides for travelling in the horizontal direction so that any motion of the test head can be split into a translational motion of the slides and a rotational motion of the articulated arms in thus achieving a reproducible location of the positioning means in ensuring reliably correct positioning of the test head.

SUMMARY OF THE INVENTION

Contrary to the precision of the positioning means as needed for a reproducible location is the fact that it has been discovered in actual practice to be an advantage when the position of the test head can be corrected by slight manual jiggling when docking at the testing device. Such a correction to the position of the test head to facilitate docking necessitates a certain compliance of the positioning means.

The invention is based on the objective of providing a compliance module which is particularly suitable for a manipulator for positioning a test head and by means of which, on the one hand, a precise location, and on the other a certain compliance is achievable.

To achieve this objective a compliance module is proposed which is provided with a housing that is securable to a component, an inner sleeve shiftingly mounted in the housing and axially urged by a spring element, and a pin arranged on the housing and connected to the inner sleeve.

The compliance module in accordance with the invention particularly for application on a manipulator for positioning a test head now makes it possible to jiggle movably mounted components, for example means for positioning a test head three-dimensionally, contrary to the effect of a restoring force between a first position and a second position, resulting in the component being endowed with a certain compliance. The restoring force caused by the spring element in the axial direction of the compliance module ensures that despite the compliance generated by the compliance module, a component holding the test head, for example, is suitable to be moved precisely reproducibly.

Advantageous further embodiments of the compliance module in accordance with the invention read as the claimed subject matter.

Thus, to advantage, the pin is shiftingly mounted on the housing so that the pin supporting the inner sleeve radially can be moved together with the inner sleeve.

To achieve a simple connection of the pin to the inner sleeve, preferably the inner sleeve comprises a female thread and the pin comprises a threaded portion mating with the female thread. In this case it has further discovered to be of advantage when the pin comprises a head which positions the inner sleeve contrary to the effect of the spring element in the housing. The head of the pin represents a stop in the axial direction of the compliance module enabling the spring element engaging the inner sleeve to be biased. The amount of this bias depends on the distance between the inner sleeve and the head of the pin. By altering the extent by which the pin is screwed into the inner sleeve, the distance between the inner sleeve and the head of the pin can be varied in thus setting the bias. It is because of this bias that it is assured that it is only possible to move the component when a force exceeding the bias is applied to the component.

Preferably the pin is rotatably mounted by means of a bearing sleeve and the inner sleeve non-rotatably mounted in the housing, in thus enabling the pin to be screwed into the inner sleeve or screwed out thereof to vary the bias.

In one preferred aspect of the compliance module in accordance with the invention the housing comprises an axially slot and the inner sleeve is provided with a slaving member engaging the slot. The slaving member guided by the slot holds the inner sleeve in the housing against the bias exerted by the spring element on the inner sleeve and thus assuring non-rotatable mounting of the inner sleeve. The length of the slot dictates the distance by which the inner sleeve is shiftable in the housing.

To achieve low-friction shifting the inner sleeve is expediently provided with a sliding surface contacting the housing.

For a simple, compact design it is of advantageous to provide the inner sleeve with a boss for supporting the spring element, The boss is expediently arranged so that the spring element is reliably guided by a portion of the inner sleeve.

In another preferred aspect of the compliance module in accordance with the invention the inner sleeve is provided with a stopper plate. The stopper plate serves to urge a movably mounted component, for instance a plate mounting a test head, with the restoring force as exerted by the spring element. For this purpose the stopper plate may be made of a suitable material for high impact performance, for example.

To achieve the objective as cited above it is further proposed, as it reads from claim 10, a manipulator serving particularly to position a test head on a testing device. The manipulator is provided with means for positioning a test head three-dimensionally and at least one compliance module. By means of the compliance module a movably mounted component can be moved against a restoring force between a first position and a second position.

One such manipulator is accorded the advantages of the compliance module in accordance with the invention.

Advantageous aspects of the manipulator in accordance with the invention read from the claimed subject matter.

Thus, it is of advantage when the movably mounted component features a first contact flat and a second contact flat oriented substantially parallel to each other. The first contact flat is urged by a first compliance module, whereas the second contact flat is urged in the opposite sense by a second compliance module. It is in this way that the movably mounted component can be moved between a first position and a second position in the axial direction of the compliance modules. The restoring force exerted by the compliance modules on the movably mounted component ensures that the component on having left the first position, in other words the home position, is always returned thereto. Because of the compliance modules being arranged opposite in sense the component returns to the home position both from a motion in the direction of the first compliance module and from a motion in the direction of the second compliance module.

In a preferred aspect the manipulator in accordance with the invention is provided with a support for the test head, the support comprising two side arms between which the test head is tensioned. The side arms tensioning the test head ensure safe securement of the test head even when it is relatively heavy.

To advantage, the side arms are each provided with at least one fastener plate to which the test head is secured and which is movably mounted. The fastener plate constitutes a movably mounted component in the aforementioned sense engaged by at least one compliance module.

Preferably the fastener plate is arranged linearly displaceable. So that the position of the test head secured to the fastener plate can be corrected by manual jiggling. As an alternative the fastener plate can be arranged pivotable, enabling the position of the test head secured to the fastener plate to be corrected by jiggling. Advantageously, the fastener plate can be locked in a defined position by locking means to achieve a fixed arrangement of the test head, when required.

BRIEF DESCRIPTION OF THE DRAWINGS

Details and further advantages of the present invention read from the following description of a preferred example embodiment as merely shown diagrammatically in the corresponding drawings in which:

FIG. 2*b* is a side view of the side arm as shown in FIG. 2*a* showing the fastener plate in a second position II;

DETAILED DESCRIPTION OF THE INVENTION

Figure 1:
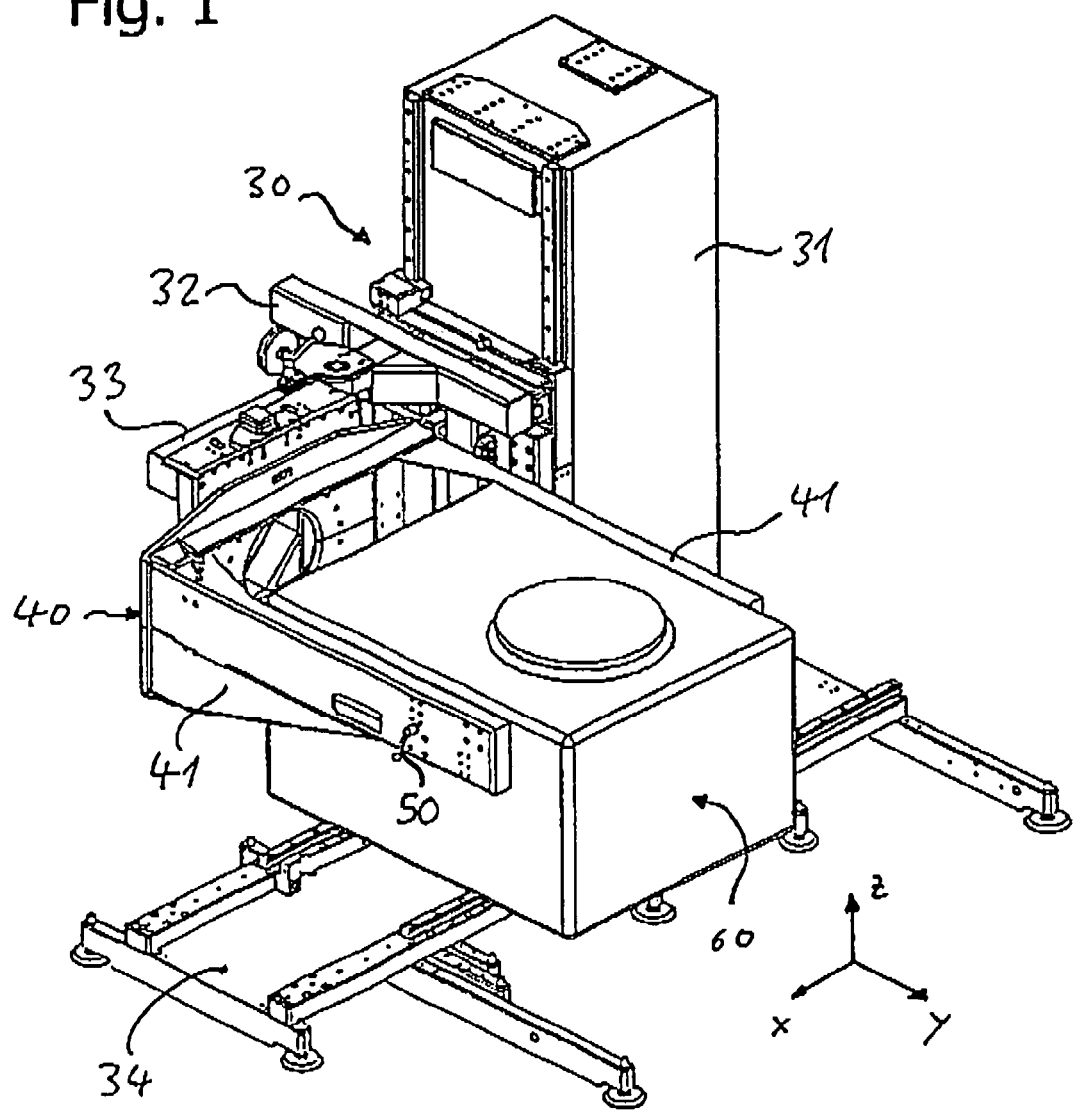
FIG. 1 is a view in perspective of a manipulator, on which a test head is arranged.

Referring now to FIG. 1 there is illustrated a manipulator serving to position a test head 60 on a testing device (not shown) for electronic devices, such as, for example, ICs or wafers. For this purpose the manipulator features positioning means 30 comprising a column 31 extending in the vertical direction z. The column is shiftingly mounted on a base frame 34 in a horizontal longitudinal direction x. Arranged on the column 31 is a cross-slide 32 shiftingly mounted in the vertical direction z. The cross-slide 32 extending in a horizontal crosswise direction y is connected to a pivoting arm 33. The pivoting arm 33 is pivotable about an axis extending in the vertical direction z and shiftingly mounted in the horizontal crosswise direction y by means of the cross-slide 32.

As further evident from FIG. 1 arranged on the pivoting arm 33 is a support 40 for the test head 60. The support 40 comprises two side arms 41 between which the test head 60 is tensioned. For this purpose each of the side arms 41 is provided with two fastener plates 42, 46 to which the test head 60 is secured. The fastener plate 42 is arranged linearly shiftable both horizontally and vertically on the side arm 41 and for this purpose is guided in linear guide 45, as evident from FIGS. 2*a* and 2*b* in particular. By contrast, the fastener plate 46 is arranged pivotable about a trunnion 49 on the fastener plate 42. It is in this way that the fastener plate 46 together with the fastener plate 42 can be shifted along the side arm 41 to achieve, for example, a so-called "theta" motion of the test head 60. A locking lever 50 ensures that the test head 60 can be locked in the desired home position, whereas a locking lever 51 permits locking the fastener plate 42 in the desired vertical position. Each of the fastener plates 42, 46 comprises a first contact flat 43, 47 and second contact flat 44, 48 oriented substantially parallel to each other. Engaging the first contact flat 43, 47 is a compliance module 10*a*, the second contact flat 44, 48 being engaged by a compliance module 10*b*. The first compliance module 10*a* and the second compliance module 10*b* are arranged such that the fastener plates 42, 46 are urged in opposite directions.

Figure 3:
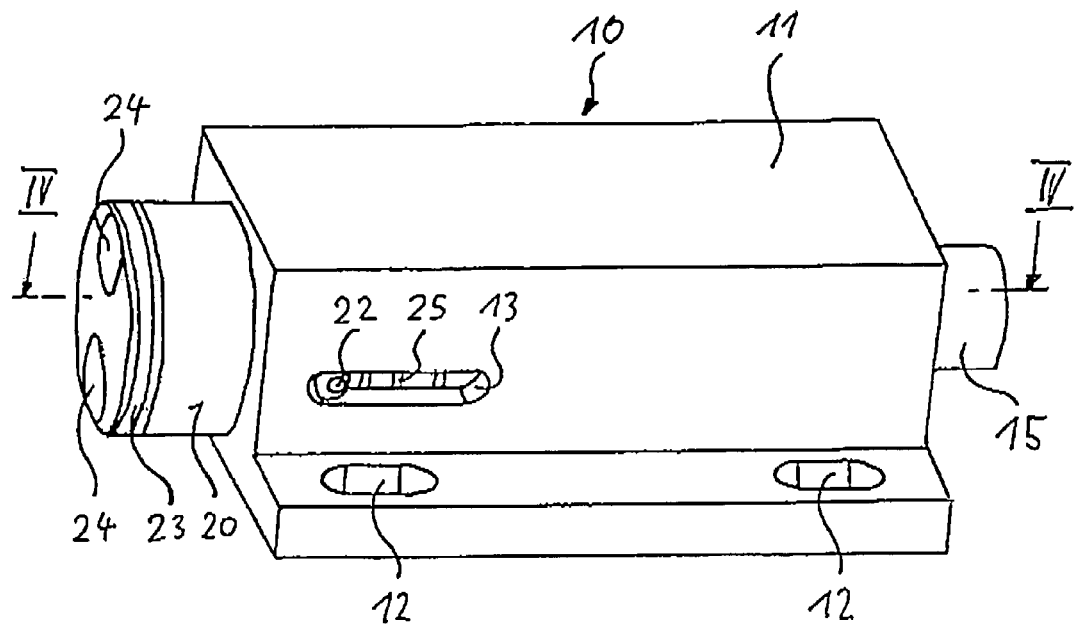
FIG. 3 is a view in perspective of a compliance module.
Figure 4:
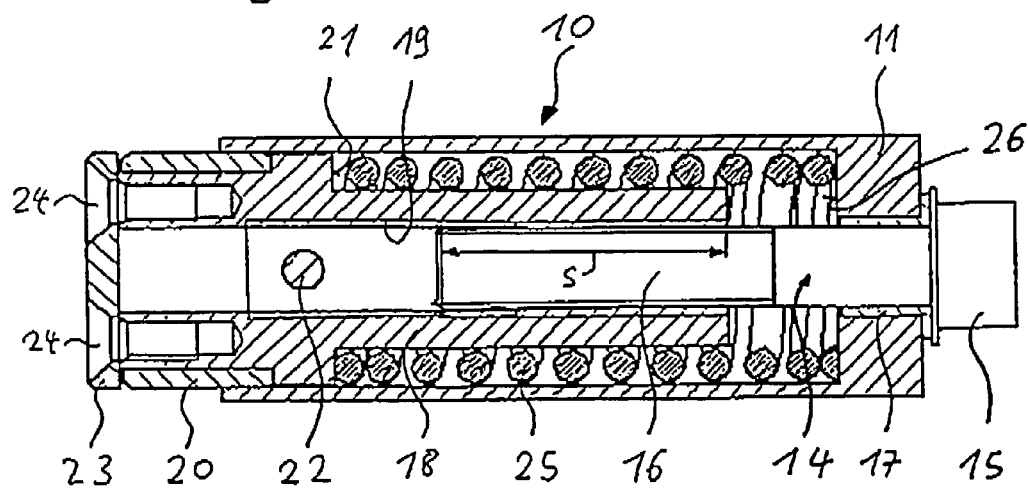
FIG. 4 is a section taken along the line IV-IV in FIG. 3.

Referring now to FIG. 3 and FIG. 4 there is illustrated how the compliance module 10 comprises a housing 11 secured to the fastener plates 42, 46. For this purpose the housing 11 is provided with a hole 12. Shiftingly mounted in an axial direction of the compliance module 10 in the housing 11 is an inner sleeve 18 which for this purpose features a sliding surface area 20 contacting an inner wall of the housing 11. Furthermore, the inner sleeve 18 is provided with a slaving member 22 supporting a first end of a spring element 25. A second end of the spring element 25 is supported by an abutment 26 of the housing 11. The spring element 25 guided by a portion of the inner sleeve 18 accordingly urges the inner sleeve 18 in the axial direction.

The compliance module 10 is further provided with a pin 14 which by means of a bearing sleeve 17 is rotatably mounted about an axis extending in the axial direction. The pin 14 comprises a head 15 contacting the bearing sleeve 17 axially and a threaded portion 16 projecting into the inner sleeve 18, the threaded portion 16 mating with a female thread 19 of the inner sleeve 18. Because of a slaving member 22 axially guided in a slot 13 of the housing 11, the inner sleeve 18 is non-rotatably mounted in the housing 11, as a result of which a screw-in distance s by which the pin 14 projects into the inner sleeve 18 can be varied by rotation of the pin 14. For this purpose the head 15 may feature flats to facilitate rotating the pin 14 by means of a wrench, for example.

Varying the screw-in distance s alters the distance between the slaving member 22 of the inner sleeve 18 and the abutment 26 of the housing 11. The spring element 25 supported by the slaving member 22 and the abutment 26 can thus be biased. By how much the inner sleeve is biased can thus be adapted to each case without making it necessary to replace the spring element 25.

Figure 2A:
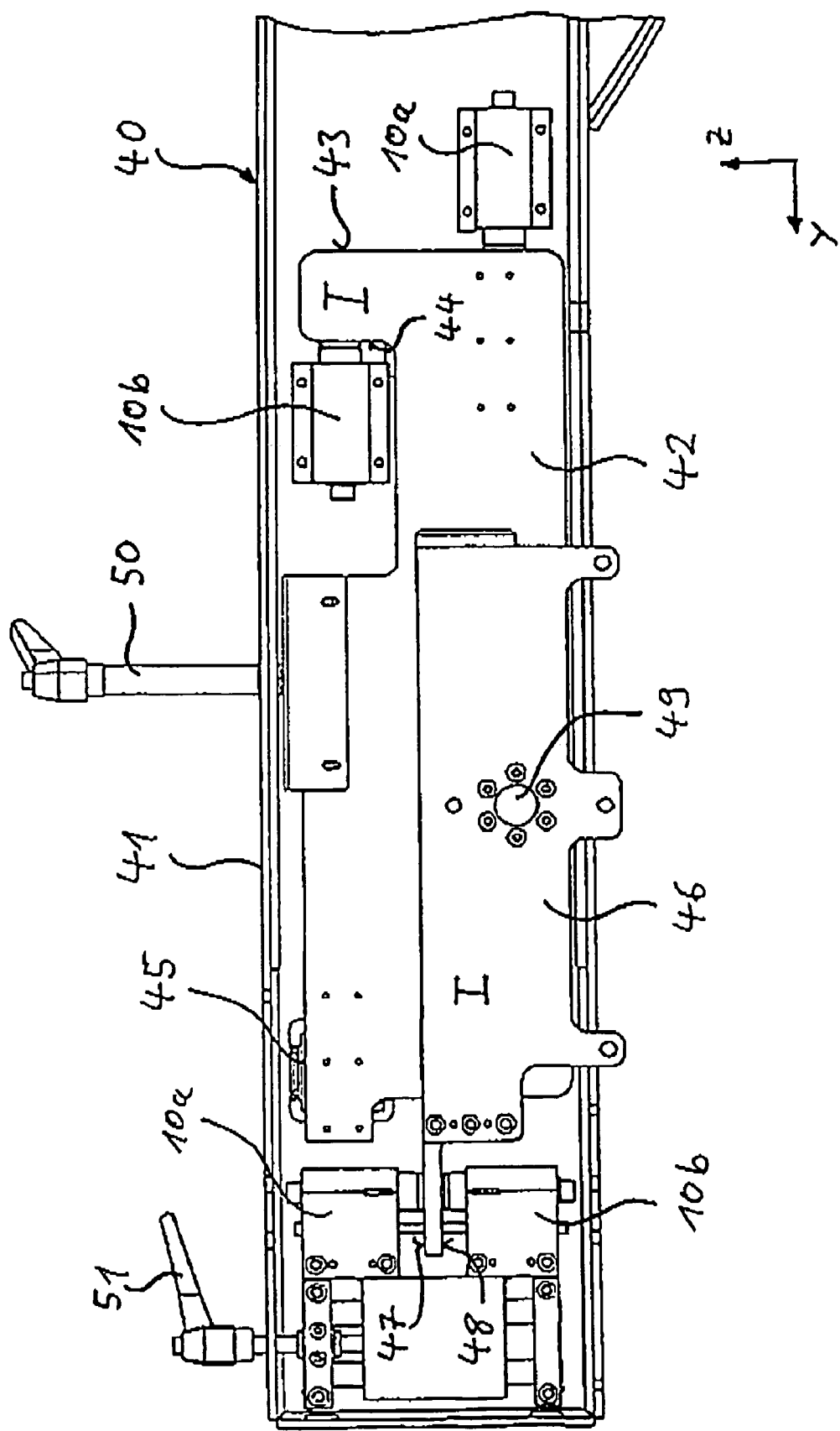
FIG. 2*a* is a side view of a side arm showing a fastener plate moveably mounted on the side arm in a first position I.

The inner sleeve 18 features a front end facing away from the pin 14. Secured to the front end by means of screw 24 is a stopper plate 23. The stopper plate 23 made, for example, of a high impact material, adjoins the contact flats 43, 44, 47, 48 of the fastener plates 42 46. Moving the fastener plates 42, 46 from the first position I as shown in FIG. 2a into the second position II as shown in FIG. 2b results in this displacement counteracting the restoring force produced by the compliance modules 10a, 10b, i.e. irrespective of whether the fastener plates 42, 46 are moved in the direction of the compliance module 10a or in the direction of the compliance module 10b. This is because of the inner sleeve 18 of the compliance modules 10a, 10b which is axially shiftable by the length of the slot 13 in the housing 11. When the slaving member 22 of the inner sleeve 18 guided in the slot 13 is located in the first position I, in other words in the home position, for example roughly in the middle of the slot 13, the inner sleeve 18 can then be shifted axially both to the left and right. The ends of the slot 13 define the shift of the inner sleeve 18 in thus defining the maximum end position II as can be assumed by the fastener plates 42, 46. The bias to which the spring element 25 is subjected in the home position I can be set by the pin 14 in thus ensuring that the fastener plates 42, 46 are urged by the compliance modules 10a, 10b also in the home position I.

The manipulator as described above permits by the positioning means 30 precise positioning of the test head 60. In addition, the compliance modules 10a, 10b ensure a certain compliance of the fastener plates 42, 46 to which the test head 60 is secured, since the fastener plates 42, 46 can be moved between the home position I and the end position II contrary to the effect of a restoring force in thus making it possible to correct the position of the test head 60 by manual jiggling. The restoring force produced by the compliance modules 10a, 10b ensures that the fastener plates 42, 46 are always returned to the home position I so that reliably precise positioning of the test head 60 is not detrimented because of the compliance existing due to the compliance modules 10a, 10b. This is also supported by it only being possible to move the fastener plates 42, 46 when a force exceeding the bias acts on the fastener plates 42, 46 because of the spring element 25 as a result of the bias of the compliance modules 10a, 10b. In conclusion, the compliance modules 10a, 10b are characterized by a simple, compact configuration which takes into account the requirements of cost-effective production.

What is claimed is:

1. A manipulator serving to position a test head at a testing device, comprising:
    a positioner for positioning said test head three-dimensionally, the positioner comprising a first component, and a second component mounted moveably between a first position and a second position; and
    at least one compliance module, the compliance module comprising:
        a housing being secured to the first component;
        a spring element mounted in the housing and being biased in an axial direction;
        an inner sleeve shiftingly mounted in said housing and urged by the spring element in the axial direction, and
        a pin shiftingly mounted on the housing and connected to the inner sleeve,
    wherein the inner sleeve comprises a boss supporting the spring element, a female thread, and a stopper plate abutting on the second component, the inner sleeve being shiftingly mounted in the axial direction and non-rotatably mounted about an axis extending in the axial direction;
    wherein the pin comprises a head positioning the inner sleeve against the effect of the spring element in the housing, and a threaded portion mating with the female thread, the pin being shiftingly mounted in the axial direction and rotably mounted about the axis extending in the axial direction;
    wherein the inner sleeve and the pin are jointly moveable in the axial direction by a force exceeding the bias of the spring element and being applied to the stopper plate by a movement of the second component between the first position and the second position.

2. The manipulator as set forth in claim 1, wherein said second component being configured as a fastener plate and comprises a first contact flat and a second contact flat oriented substantially parallel to each other, said first contact flat being urged by a first said compliance module, and said second contact flat being urged in the opposite sense by a second said compliance module.

3. The manipulator as set forth in claim 1, wherein the first component being configured as a support for said test head, said support comprising two side arms between which said test head is tensioned.

4. The manipulator as set forth in claim 3, wherein said side arms are each provided with at least one fastener plate to which said test head is secured and which is movably mounted.

5. The manipulator as set forth in claim 4, wherein the fastener plates are arranged linearly displaceable.

6. The manipulator as set forth in claim 4, wherein the fastener plates are arranged pivotable.

7. The manipulator as set forth in claim 4, further comprising a locking means configured to lock the fastener plates in a defined position.

8. The manipulator as set forth in claim 1, further comprising a bearing sleeve configured to support the pin.

9. The manipulator as set forth in claim 1, wherein said housing comprises an axial slot and said inner sleeve comprises a slaving member engaging the slot.

10. The manipulator as set forth in claim 1, wherein said inner sleeve comprises a sliding surface contacting said housing.

11. A manipulator serving to position a test head at a testing device, comprising:
    means for positioning said test head three-dimensionally comprising:
        a support for said test head, the support comprising a first component, and
        a second component mounted moveably between a first position and a second position; and
        at least one compliance module, the compliance module comprising
            a housing being secured to the first component;
            a spring element mounted in the housing and being biased in an axial direction;
            an inner sleeve shiftingly mounted in the housing and urged by the spring element in the axial direction; and
            a pin shiftingly mounted on the housing and connected to the inner sleeve;
        wherein the inner sleeve comprises a boss supporting the spring element, a female thread, and a stopper plate abutting on the second component, the inner sleeve being shiftingly mounted in the axial direction and non-rotatably mounted about an axis extending in the axial direction;

wherein the pin comprises a head positioning the inner sleeve against the effect of the spring element in the housing, and a threaded portion mating with the female thread, the pin being shiftingly mounted in the axial direction and rotatably mounted about the axis extending in the axial direction;

wherein the inner sleeve and the pin are jointly moveable in the axial direction by a force exceeding the bias of the spring element and being applied to the stopper plate by a movement of the second component between the first position and the second position.

12. The manipulator as set forth in claim 11, wherein the second component comprises a first contact flat and a second contact flat oriented substantially parallel to each other, the first contact flat being urged by a first said compliance module, and the second contact flat being urged in the opposite sense by a second said compliance module.

13. The manipulator as set forth in claim 11, wherein the support comprises two first components, wherein the support comprises two side arms between which said test head is clamped, each of the side arms defining a respective one said first component.

14. The manipulator as set forth in claim 13, wherein the second component comprises a first contact flat and a second contact flat oriented substantially parallel to each other, the first contact flat being urged by a first said compliance module, and the second contact flat being urged in the opposite sense by a second said compliance module, wherein each of the side arms comprises at least one fastener plate to which said test head is secured and which is moveably mounted, the fastener plates defining the second component.

15. The manipulator as set forth in claim 14, wherein the fastener plates are arranged linearly displaceable.

16. The manipulator as set forth in claim 14, wherein the fastener plates are arranged pivotable.

17. The manipulator as set forth in claim 14, further comprising a locking means configured to lock the fastener plates in a defined position.

18. The manipulator as set forth in claim 11, further comprising a bearing sleeve configured to support the pin.

19. The manipulator as set forth in claim 11, wherein said housing comprises an axial slot and said inner sleeve comprises a slaving member engaging the slot.

20. The manipulator as set forth in claim 11, wherein said inner sleeve comprises a sliding surface contacting said housing.

* * * * *